US005771562A

United States Patent [19]
Harvey, III et al.

[11] Patent Number: 5,771,562
[45] Date of Patent: Jun. 30, 1998

[54] PASSIVATION OF ORGANIC DEVICES

[75] Inventors: Thomas B. Harvey, III, Scottsdale; Franky So, Tempe, both of Ariz.

[73] Assignee: Motorola, Inc., Schaumburg, Ill.

[21] Appl. No.: 433,909

[22] Filed: May 2, 1995

[51] Int. Cl.$^6$ ........................................................ H01S 4/00
[52] U.S. Cl. ......................... 29/592.1; 257/433; 257/710; 313/504; 313/512
[58] Field of Search ........................... 29/592.1; 257/433, 257/710; 313/504, 512; 445/25, 41, 43

[56]  References Cited

U.S. PATENT DOCUMENTS

| | | | |
|---|---|---|---|
| 3,217,169 | 11/1965 | Grimmeiss et al. | 313/512 |
| 3,807,833 | 4/1974 | Graham et al. | 445/25 |
| 4,097,889 | 6/1978 | Kern et al. . | |
| 4,767,679 | 8/1988 | Kawachi | 313/504 |
| 5,047,687 | 9/1991 | Van Slyke | 313/503 |
| 5,059,861 | 10/1991 | Littman et al. | 313/503 |
| 5,073,446 | 12/1991 | Scozzafava et al. | 428/323 |
| 5,124,204 | 6/1992 | Yamashita et al. | 313/512 |
| 5,394,011 | 2/1995 | Yamamoto et al. | 257/710 |

OTHER PUBLICATIONS

Radio Shack Dictionary of Electronics, 1974–1975, Def. of "Passivation" p. 410.

*Primary Examiner*—P. W. Echols
*Attorney, Agent, or Firm*—Eugene A. Parsons

[57]  ABSTRACT

A method of passivating organic devices positioned on a supporting substrate including the steps of overcoating the organic device with a low temperature deposited film of dielectric material, and sealingly engaging an inorganic layer over the dielectric material so as to substantially hermetically seal the organic device. In a typical embodiment, the dielectric layer is $SiO_2$ and the inorganic layer is a metal can.

15 Claims, 1 Drawing Sheet

PASSIVATION OF ORGANIC DEVICES

FIELD OF THE INVENTION

The present invention pertains to organic devices and more specifically to passivated organic devices and methods of passivation.

BACKGROUND OF THE INVENTION

Organic devices, and especially organic light emitting diodes (LEDs) and the like, generally utilize a layer of reactive metal in the cathode to ensure efficient electron injecting electrodes and low operating voltages. However, the reactive metals are susceptible to oxygen and moisture, especially during operation, since oxidation of the metal limits the lifetime of the devices. A hermetic seal is normally required to achieve long term stability and longevity. Several types of hermetic seals are utilized, the most common of which are inorganic materials, such as metals and the like.

A further problem that occurs in the fabrication and passivation of organic devices is a result of the fact that the organic layers of the organic devices can not withstand very high temperatures (i.e. generally greater than approximately 300° C.). In many instances, even approaching the critical temperatures of the organic layers, especially if the elevated temperatures are maintained for relatively long periods of time, can degrade the organic material and reduce the reliability and/or the longevity.

A recent process of hermetically sealing organic devices is to overcoat them with an inorganic material, such as a ceramic or metal, to achieve a hermetic seal. However, the organic devices are very susceptible to the high temperatures normally required in the deposition of ceramics and metals. Thus, the ceramic or metal material generally must be deposited by PECVD methods in order to meet the low temperature criteria. The major problem with this method of sealing is that during the PECVD deposition there is a strong possibility of radiation damage to the organic device.

Accordingly, it is highly desirable to devise a relatively inexpensive and convenient method of hermetically sealing organic devices.

It is a purpose of the present invention to provide a new and improved method of passivating organic devices.

It is a purpose of the present invention to provide a new and improved method of passivating organic devices at relatively low temperatures.

It is another purpose of the present invention to provide a new and improved method of passivating organic devices which is relatively convenient and inexpensive to perform.

SUMMARY OF THE INVENTION

The above problems and others are at least partially solved and the above purposes and others are realized in a method of passivating organic devices positioned on a supporting substrate including the steps of overcoating the organic device with a low temperature deposited film of dielectric material, and sealingly engaging an inorganic layer over the dielectric material so as to substantially hermetically seal the organic device.

In a typical embodiment, the dielectric layer is $SiO_2$ and the inorganic layer is a metal can. Also, in some embodiments a getter material can be provided in the metal can to remove any resident oxygen or moisture and to eliminate small amounts that might leak in, thereby further increasing the longevity of the organic devices.

BRIEF DESCRIPTION OF THE DRAWINGS

Referring to the drawings, wherein like characters indicate like parts throughout the various views.

DESCRIPTION OF THE PREFERRED EMBODIMENTS

Figure 1:
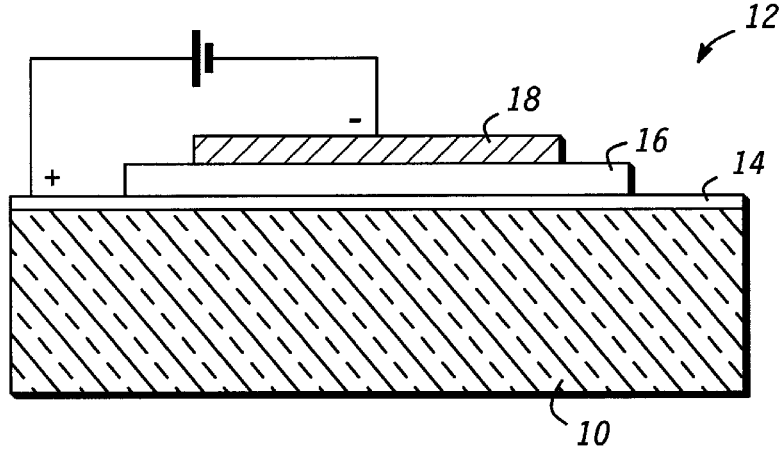
FIG. 1 is a simplified cross-sectional view of an organic light emitting diode.

Referring specifically to FIG. 1, a substrate 10 is illustrated which is, in this specific embodiment, some optically clear material, such as glass, quartz, a transparent semiconductor material or the like, etc. A typical organic light emitting diode 12 (LED) is positioned on substrate 10, generally by fabricating LED 12 directly on substrate 10 in any of the various methods of fabricating organic LEDs.

In this specific example, LED 12 includes a thin film of transparent conductive material 14, such as indium-tinoxide (ITO) or the like, deposited on the upper surface of substrate 10. An organic electroluminescent layer 16 is deposited on the upper surface of conductive layer 14 by any convenient means. Organic electroluminescent layer 16 generally represents the active organic layers of LED 12 and may include from one to several sub-layers, as is understood by those skilled in the art. A metallic contact 18 is positioned on the upper surface of organic electroluminescent layer 16 to serve as the cathode of LED 12. Contact 18 includes at least a thin layer of a reactive, low work function metal which, as described above, is susceptible to oxygen and moisture content in the surrounding atmosphere and must, therefore, be passivated to provide reliability and a reasonable longevity.

Figure 2:
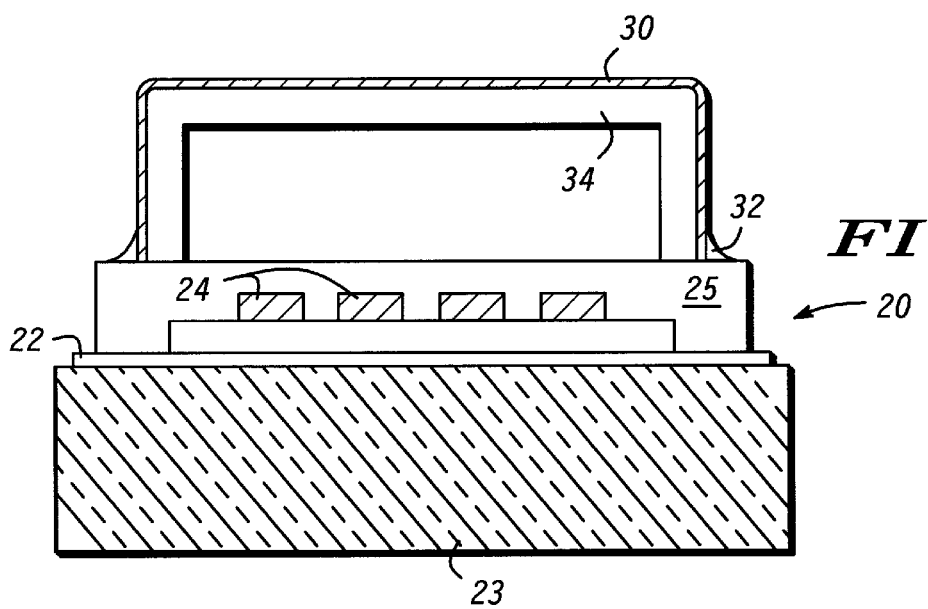
FIG. 2 is a simplified cross-sectional view of an organic light emitting diode array illustrating a method of passivation in accordance with the present invention.

A method of passivating one or more LEDs in accordance with the present invention is illustrated in FIG. 2. In FIG. 2 a plurality of LEDs is illustrated in the form of an organic LED array 20. As will be understood by those skilled in the art, a layer 22 of transparent conductive material, such as ITO, is positioned on the upper surface of a substrate 23, which substrate is also transparent and may be, for example, glass or the like. Layer 22 is patterned into rows and a plurality of LEDs are formed on the rows of layer 22. Upper metallic contacts 24 for each of the LEDs are connected into columns so that each of the LEDs in array 20 are individually addressable.

In a first step of this specific embodiment array 20 is overcoated or encapsulated with a low temperature deposited film 25 of dielectric material. A typical example of a low temperature deposited film of dielectric material is silicon dioxide ($SiO_2$), which is deposited by evaporating silicon monoxide (SiO) in an oxygen ($0_2$) containing atmosphere at approximately $10^{-4}$ Torr. Generally, the thickness of film 25 depends upon the type of LEDs utilized and the thicknesses of the active layers. However, assuming that standard LEDs are fabricated, a layer having a thickness in the range of approximately 500 to 1500 angstroms is generally thick enough to perform the desired functions. Film 25 then provides some additional protection for the following steps.

A metal can 30, or similar impervious cap (e.g. metal foil, metallized polymer film such as metallized polyester, etc.), is then sealingly engaged over array 20 on film 25. In a preferred embodiment, a metal pattern (not shown) is applied to the upper surface of film 25 surrounding array 20 and metal can 30 is positioned over array 20 on the metal pattern, while the structure is still in the $10^{-4}$ Torr. vacuum of the film deposition step. Metal can 30 is then sealed over array 20, at 32, utilizing a low temperature solder seal. A typical low temperature solder that can be used for this purpose is indium based solder. In some specific applications, and if a solder with a sufficiently low melting temperature is used, it may be possible to simply seal metal can 30 directly to a surface of substrate 23. For purposes of this disclosure, it should be noted that indium solder with a melting point of 70° C.–117° C. can be obtained.

If additional protection is required or desired, a film 34 of getter material can be formed inside of metal can 30, for example, as a lining of metal can 30 or as a layer of material on the upper surface of film 25. Generally, low work function metals, such as lithium (Li) or magnesium (Mg), are utilized as a gettering material to absorb trapped or resident gases within metal can 30 or small amounts that might leak into metal can 30 subsequent to sealing.

By incorporating gettering film 34 into metal can 30, small amounts of leakage are absorbed so that in some special applications it is possible to seal metal can 30 onto film 25 or the like with an organic adhesive. Generally, organic adhesives do not require elevated temperatures and, if metal can 30 is properly fitted to film 25, the thickness of the organic adhesive seal 32 is a minimum.

Thus, depending upon the application and the amount of protection required, various combinations of metal can 30, film 25 of dielectric material, gettering film 34 and different types of sealing material at seal 32 can be easily and conveniently incorporated into a fabrication process. It should also be noted that film 25 generally has a lower permeability than array 20 and metal can 30 is substantially impermeable, so that the overall structure has a better resistance to permeation than prior structures that are simply encapsulated with a layer of inorganic material. Also, because film 25 is deposited at low temperatures and metal can 30 is sealed at low temperatures, array 20 is not damaged, degraded, or otherwise compromised by the encapsulation operation or by thermal cycling of the finished product. Further, the present invention includes a more manufacturable process than prior art methods and devices.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of hermetically sealing organic light emitting devices comprising the steps of:
   providing an organic light emitting device on a supporting substrate;
   overcoating the organic light emitting device with a film of inorganic dielectric material deposited at a temperature less than approximately 300° C.
   sealingly engaging an inorganic layer over the dielectric material so as to substantially hermetically seal the organic light emitting device.

2. A method of hermetically sealing organic light emitting devices as claimed in claim 1 wherein the step of overcoating the organic light emitting device with the dielectric material includes evaporating the dielectric material in a low pressure oxygen atmosphere to produce the film on the organic light emitting device.

3. A method of hermetically sealing organic light emitting devices as claimed in claim 2 wherein the step of evaporating the dielectric material includes evaporating silicon monoxide in a low pressure oxygen atmosphere to produce a film of silicon dioxide on the organic light emitting device.

4. A method of hermetically sealing organic light emitting devices as claimed in claim 3 wherein the step of evaporating silicon oxide in a low pressure oxygen atmosphere to produce a film of silicon dioxide includes evaporating the silicon oxide in an oxygen atmosphere at approximately $10^{-4}$ Torr.

5. A method of hermetically sealing organic light emitting devices as claimed in claim 1 wherein the step of sealingly engaging the inorganic layer over the dielectric material includes the steps of providing a metal can and sealingly engaging the metal can over the film of dielectric material so as to substantially hermetically seal the organic light emitting device.

6. A method of hermetically sealing organic light emitting devices as claimed in claim 5 wherein the step of sealingly engaging the metal can over the film of dielectric material includes affixing the metal can over the film of dielectric material while retaining the organic light emitting device in an atmosphere at approximately $10^{-4}$ Torr.

7. A method of hermetically sealing organic light emitting devices as claimed in claim 5 wherein the step of sealingly engaging the metal can includes utilizing a low temperature solder seal.

8. A method of hermetically sealing organic light emitting devices as claimed in claim 7 wherein the step of sealingly engaging the metal can utilizing the low temperature solder seal includes utilizing indium based solder.

9. A method of hermetically sealing organic light emitting devices as claimed in claim 5 including in addition a step of depositing a layer of a gettering material prior to sealingly engaging the metal can over the film of dielectric material, so as to position the layer of gettering material inside the metal can.

10. A method of hermetically sealing organic light emitting devices as claimed in claim 9 wherein the step of sealingly engaging the metal can over the film of dielectric material includes utilizing an organic adhesive.

11. A method of hermetically sealing organic light emitting devices as claimed in claim 9 wherein the step of depositing the gettering material includes depositing a layer of low work function metal including one of lithium and magnesium.

12. A method of hermetically sealing organic light emitting devices comprising the steps of:
   providing an organic light emitting device on a supporting substrate;
   overcoating the organic light emitting device with an inorganic dielectric material deposited at a temperature less than approximately 300° C.;
   providing a metal can; and
   sealing the metal can over the dielectric coating so as to substantially hermetically seal the organic light emitting device.

13. A method of hermetically sealing organic light emitting devices as claimed in claim 12 wherein the step of overcoating the organic light emitting device with the dielectric material includes evaporating the dielectric material in a low pressure oxygen atmosphere to produce the film on the organic light emitting device.

14. A method of hermetically sealing organic light emitting devices as claimed in claim 13 wherein the step of evaporating the dielectric material includes evaporating silicon oxide in a low pressure oxygen atmosphere to produce a film of silicon dioxide on the organic light emitting device.

15. A method of hermetically sealing organic light emitting devices as claimed in claims 14 wherein the step of evaporating silicon oxide in a low pressure oxygen atmosphere to produce a film of silicon dioxide includes evaporating the silicon oxide in an oxygen atmosphere at approximately $10^{-4}$ Torr.

* * * * *